United States Patent [19]
Scharr et al.

[11] Patent Number: 5,346,857
[45] Date of Patent: Sep. 13, 1994

[54] METHOD FOR FORMING A FLIP-CHIP BOND FROM A GOLD-TIN EUTECTIC

[75] Inventors: Thomas A. Scharr, Mesa; Russell T. Lee, Phoenix; Ravichandran Subrahmanyan, Scottsdale, all of Ariz.

[73] Assignee: Motorola, Inc., Schaumburg, Ill.

[21] Appl. No.: 952,005

[22] Filed: Sep. 28, 1992

[51] Int. Cl.[5] .................. H01L 21/283; H01L 21/58; H01L 21/60; H01L 21/603
[52] U.S. Cl. ..................... 437/183; 437/188; 437/196; 437/209; 228/180.22; 228/254
[58] Field of Search ............. 437/183, 184, 188, 196, 437/209; 228/180.2, 254, 180.22; 257/737, 738, 772, 778

[56] References Cited

U.S. PATENT DOCUMENTS

| | | | |
|---|---|---|---|
| 3,874,072 | 4/1975 | Rose et al. | 437/183 |
| 4,129,042 | 12/1978 | Rosvold | 73/727 |
| 4,887,760 | 12/1989 | Yoshino et al. | 228/56.3 |
| 4,922,322 | 5/1990 | Mathew | 357/69 |
| 5,008,997 | 4/1991 | Phy | 437/209 |
| 5,090,609 | 2/1992 | Nakao et al. | 228/123 |
| 5,108,950 | 4/1992 | Wakabayashi et al. | 437/183 |

OTHER PUBLICATIONS

Thomas A. Scharr, "TAB Bonding A 200 Lead Die", The International Journal for Hybrid Microelectronics, vol. 6, No. 1, Oct. 1983, pp. 561–566.
Howard W. Markstein, "The Interconnection needs of the high-end device market for ECL. ASICs and gate arrays is being satisfied by tape automated bonding", Electronic Packaging and Production, Sep. 1990, pp. 33–36.
Jerry Lyman, "Packaging", Electronics, Dec. 29, 1981, pp. 66–75.
"Packaging that Meets the Challenges of VLSI", Electronics, Mar. 5, 1987.

Primary Examiner—Olik Chaudhuri
Assistant Examiner—David E. Graybill
Attorney, Agent, or Firm—Rennie William Dover

[57] ABSTRACT

A method for flip-chip bonding an integrated circuit die to a substrate. A substrate (21) having conductive bonding areas (22) coated with tin (23) is secured to a bottom end effector of a flip-chip bonding apparatus. An integrated circuit die (26) having gold bumps (28) is secured to a die tool of the flip-chip bonding apparatus. A gold-tin eutectic bond is formed between the integrated circuit die (26) and the conductive bonding areas (22) of the substrate (21).

12 Claims, 1 Drawing Sheet

METHOD FOR FORMING A FLIP-CHIP BOND FROM A GOLD-TIN EUTECTIC

Background of the Invention

The present invention relates, in general, to semiconductor chip bonding processes and, more particularly, to flip-chip bonding processes.

An important aspect of semiconductor integrated circuit manufacture is mounting an integrated circuit die or chip to a substrate. One technique for accomplishing this task is a flip-chip bonding process. In the flip-chip bonding process, an integrated circuit die is mounted directly to a substrate, thereby eliminating wire interconnects, reducing the cost of mounting a die to a substrate, and decreasing the probability of producing non-functional integrated circuits due to the mounting process. One technique of flip-chip bonding includes flipping an integrated circuit die, mating a plurality of solder bumped bond pads on the die with corresponding bond pads on the substrate followed by either compressing or heating the die and the circuit board. This technique is capable of forming bonds without applying excessive pressure, however it does not provide bonds of sufficient quality for high frequency performance.

In an alternate flip-chip bonding technique, the bond pads on both the integrated circuit die and the circuit board are gold bumped. The plurality of gold bumps on the die are mated with the corresponding gold bumped bond pads on the circuit board. The die and circuit board are compressed and heated, thereby forming a bond. Typically, compression is accomplished by applying a force ranging between approximately 75 and 100 grams per gold bump for gallium arsenide semiconductor integrated circuits and ranging between 75 and 200 grams per gold bump for silicon semiconductor integrated circuits. An advantage of this technique is that the heights of the gold bumps may be optimized to provide a desired high frequency response. However, the force of compression required for forming bonds between the gold on the die and the gold on the circuit board may over-stress relatively fragile semiconductor substrates such as gallium arsenide. Thus, the high frequency benefits of a gold-gold bond would be negatived by damage to substrates, such as gallium arsenide, used in high frequency applications.

Accordingly, it would be advantageous to have a flip-chip bonding process that does not require large compressive forces yet provides a desirable high frequency performance. It would be further advantageous that the technique be readily incorporated into existing manufacturing flows, conserve circuit board space, and find use in multi-chip module applications.

SUMMARY OF THE INVENTION

Briefly stated, the present invention is a method for forming a flip-chip bond from a gold-tin eutectic. A semiconductor integrated circuit having at least one gold bump is flip-chip bonded to at least one conductive bonding area of a substrate. The at least one conductive bonding area is coated with tin, thus the flip-chip bond is a gold-tin eutectic.

DETAILED DESCRIPTION OF THE DRAWINGS

Figure 1:
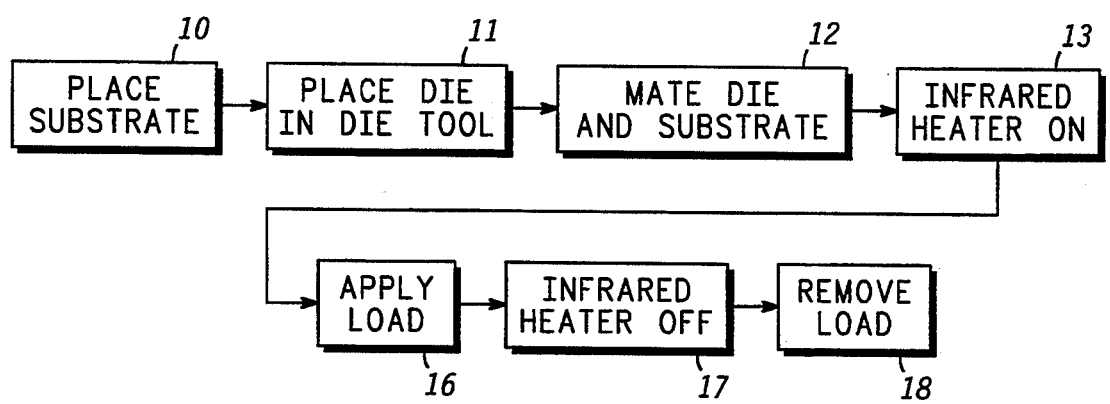
FIG. 1 illustrates a flow diagram of a flip-chip bonding process in accordance with the present invention.

Typically, an integrated circuit die is encapsulated in a package prior to mounting on a substrate such as a circuit board. Encapsulation of the die requires bonding of interconnects from the die to the package so that input and output signals may be transmitted to and from the die. A flip-chip bonding process allows bonding an integrated circuit die directly to a circuit board thereby eliminating the requirement for interconnect formation and encapsulation.

A flip-chip bond is formed in a flip-chip bonding apparatus. A flip-chip bonding apparatus may include a platform on which a bottom end effector is heated at a predetermined rate to a desired temperature. The heat may be supplied in the form of infra-red radiation by, for example, an infra-red heater. The infra-red heater provides heat to the bottom end effector. The bottom end effector is adapted to accept a substrate such as a circuit board. A top end effector is positioned above and spaced apart from the bottom end effector, wherein the top end effector may be moved along any one of the three Cartesian coordinate axes. The top end effector is adapted to accept an integrated circuit die. The top end effector includes a variable temperature die tool to which the integrated circuit die is attached. Preferably, the die tool temperature is maintained between approximately 200° C. and 250° C.

Further, a load cell assembly incorporated in the top end effector measures a force exerted by the top end effector on the integrated circuit. This force compresses the integrated circuit die with the circuit board which, in conjunction with the heat from the infrared heater, promotes bonding of the integrated circuit die to the circuit board. Flip-chip bonding apparatus are well known to those skilled in the art.

The present invention teaches a method of forming a gold-tin eutectic alloy using a flip-chip bonding apparatus and a flip-chip bonding process. A substrate, such as a circuit board, having a plurality of conductive traces, is prepared for gold-tin eutectic formation by coating conductive bonding areas of the conductive traces with tin. The conductive bonding areas on the substrate are also referred to as bond pads. Preferably the tin has a thickness of approximately 1 micrometer. Organic materials for the substrate may include FR-4, polyimide, bismaleimide triazine resin, commonly referred to as BT resin, or the like. An inorganic material for the substrate may comprise a ceramic material. The conductive traces on the substrate may be gold, copper, or other such commonly used conductive material for circuit boards. Preferably the conductive traces have a thickness of approximately 18 micrometers. Methods of forming conductive traces, coating the conductive bonding areas with tin as well as the materials used for circuit board substrates are well known in the art.

The semiconductor substrate material for integrated circuit dice may be gallium arsenide, silicon, or other semiconductor substrate materials commonly used in the art. Gold bumps are formed on bond pads located on the semiconductor substrate. The gold bumps may be gold ball bumps, coined gold ball bumps, plated gold bumps, or the like. It shall be understood the type of gold bumps are not a limitation of the present invention. Methods for forming gold bumps are well known to those skilled in the art.

Reference numeral 10 of FIG. 1 denotes a first step in the flip-chip bonding of a semiconductor integrated circuit to a substrate such as a circuit board. In this step the circuit board having a plurality of tin coated bonding areas is secured to the bottom end effector of the flip-chip bonding apparatus. The plurality of tin coated bonding areas are positioned to face the top end effector. In a subsequent step (denoted by reference numeral 11), a gold bumped die is picked from a wafer and secured in an inverted orientation to the die tool of the top end effector. Thus, the gold bumps face the tin coated bonding pads on the circuit board.

The top end effector is positioned above the bottom end effector such that the plurality of gold bumped bond pads of the integrated circuit die contact the bonding areas on the circuit board as indicated by reference numeral 12 of FIG. 1. Subsequently, the infrared heater is activated (reference numeral 13). Preferably, heat from the infra-red heater is directed only to the portion of the circuit board to which a gold-tin eutectic alloy is to be formed. In one embodiment, the infra-red heater is ramped up at a rate of approximately 50° C. per second to a temperature ranging between approximately 280° C. and 315° C. The temperature range is selected as a function of a gold-tin eutectic formation and the thermal properties of the die, die tool, substrate, top end effector, and bottom end effector. At temperatures below approximately 280° C., a gold-tin eutectic will not be formed, whereas at temperatures above approximately 315° C. the tin dissolves into the gold rather than forming a gold-tin eutectic alloy. Thus, delamination occurs between the tin coating and any underlying conductive material.

A compression load ranging between approximately 3 and 5 grams per bump is applied (reference numeral 16 of FIG. 1) to the integrated circuit die wherein the load establishes contact between the gold bumps of the integrated circuit die and the conductive bonding areas of the circuit board. The load is applied for a time ranging between approximately 3 and 10 seconds. Subsequently, the infra-red heater is turned off (reference numeral 17) and the load is removed (reference numeral 18). The circuit board to which the integrated circuit die is bonded may be re-positioned for bonding of another integrated circuit die or replaced by another circuit board so that an integrated circuit die may be bonded to this circuit board.

Figure 2:
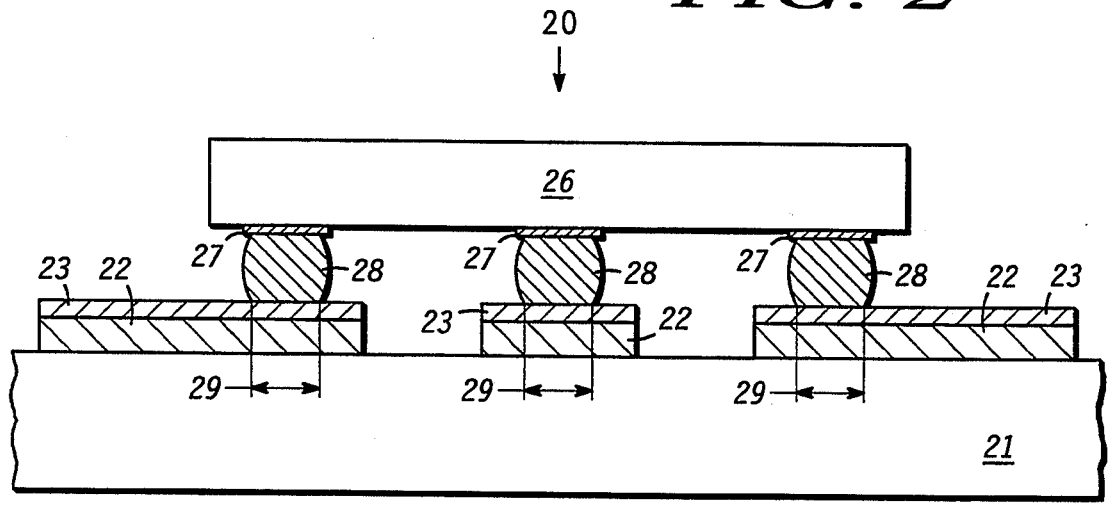
FIG. 2 illustrates a highly enlarged side view of a flip-chip bond in accordance with the present invention.

FIG. 2 illustrates a highly enlarged side view of a flip-chip bonded structure 20 in accordance with the present invention. Flip-chip bonded structure 20 includes a substrate 21 having a plurality of bonding areas on a major surface. The bonding areas may be, for example, copper 22 coated with tin 23. Further, flip-chip bonded structure 20 includes a semiconductor integrated circuit 26 having gold bumps 28 on bond pads 27. Gold bumps 28 are brought into contact with tin 23. Pressure and heat are applied to the structure as described in FIG. 1 thereby forming a gold-tin eutectic alloy in the regions indicated by lines 29.

By now it should be appreciated that the present invention provides a method for forming a flip-chip bonded structure wherein the bonding is accomplished by a gold-tin eutectic alloy. One advantage includes the use of lighter loads thereby precluding damage to stress sensitive substrates such as gallium arsenide during gold-tin eutectic formation. Further, the gold-tin eutectic alloy does not compromise the high frequency performance of the bond between the integrated circuit die and the circuit board. Another advantage is formation of the gold-tin eutectic alloy by rapidly heating and cooling the circuit board thereby precluding oxidation of the tin and allowing use in multi-chip module applications. Further, directly bonding the integrated circuit die to the circuit board lowers the costs associated with packaging by eliminating the step of encapsulating the integrated circuit die and the inherent requirement for interconnects between bond pads on an integrated circuit die and bond pads on the packages.

We claim:

1. A method for forming a flip-chip bond from a gold-tin eutectic, comprising the steps of:
   providing a semiconductor integrated circuit having at least one gold bump;
   providing a substrate having at least one conductive bonding area, the at least one conductive bonding area coated with tin; and
   flip-chip bonding the at least one gold bump with the at least one conductive bonding area to form the gold-tin eutectic.

2. A method for forming a flip-chip bond from a gold-tin eutectic as claimed in claim 1 wherein the step of providing a semiconductor integrated circuit includes providing the semiconductor integrated circuit in a gallium arsenide semiconductor substrate.

3. A method of forming a flip-chip bond from a gold-tin eutectic as claimed in claim 1 wherein the step of providing a substrate includes providing a substrate of an organic material.

4. A method for forming a flip-chip bond from a gold-tin eutectic as claimed in claim 3 wherein the step of providing a substrate includes providing a substrate comprising polyimide.

5. A method for forming a flip-chip bond from a gold-tin eutectic as claimed in claim 3 wherein the step of providing a substrate includes providing a substrate comprising FR-4.

6. A method for forming a flip-chip bond from a gold-tin eutectic as claimed in claim 1 wherein the step of providing a substrate includes providing a substrate comprising a ceramic material.

7. A method for forming a flip-chip bond from a gold-tin eutectic as claimed in claim 1 wherein the step of flip-chip bonding comprises:
   heating the substrate at approximately 50° C. per second to a temperature ranging between approximately 280° C. and 315° C.; and
   providing a compression load ranging between approximately 3 and 5 grams per bump, wherein the compression load serves to establish contact between the at least one gold bump and the at least one conductive bonding area.

8. A flip-chip method for bonding a semiconductor integrated circuit to a circuit board, comprising the steps of:
   providing a semiconductor integrated circuit having a plurality of gold bumps;
   providing a circuit board having a plurality of bonding areas, the plurality of bonding areas coated with tin and patterned to mate with the plurality of gold bumps;

flip-chip bonding the plurality of gold bumps with the plurality of bonding areas wherein the step of flip-chip bonding forms a gold-tin eutectic.

9. A flip-chip method for bonding a semiconductor integrated circuit to a circuit board as claimed in claim 8 wherein the step of flip-chip bonding includes:

providing a temperature between approximately 280° C. and 315° C.; and providing a compression load ranging between approximately 3 and 5 grams per bump for a time ranging between substantially 3 seconds and 10 seconds.

10. A flip-chip method for bonding a semiconductor integrated circuit to a circuit board as claimed in claim 8 wherein the step of providing a semiconductor integrated circuit includes providing a gallium arsenide semiconductor integrated circuit.

11. A flip-chip method for bonding a semiconductor integrated circuit to a circuit board as claimed in claim 8 wherein the step of providing a circuit board includes providing an FR-4 circuit board.

12. A flip-chip method for bonding a semiconductor integrated circuit to a circuit board as claimed in claim 8 wherein the step of providing a circuit board includes providing a polyimide circuit board.

* * * * *